United States Patent [19]

Tanaka et al.

[11] Patent Number: 5,710,525
[45] Date of Patent: Jan. 20, 1998

[54] RADIO-FREQUENCY MODULE WITH PHASE LOCK LOOP AND FREQUENCY SETTING

[75] Inventors: Masahiro Tanaka; Susumu Sakuma, both of Mobara, Japan

[73] Assignee: Futaba Denshi Kogyo K.K., Mobara, Japan

[21] Appl. No.: 577,249

[22] Filed: Dec. 22, 1995

[30] Foreign Application Priority Data

Dec. 22, 1994 [JP] Japan .................................. 6-335409

[51] Int. Cl.⁶ ........................... H03L 7/093; H03L 7/095; H04L 27/12
[52] U.S. Cl. .................. 331/16; 331/17; 331/DIG. 2; 332/100; 375/303; 375/376
[58] Field of Search ................... 331/16, 17, 25, 331/DIG. 2; 332/100; 375/303, 376

[56] References Cited

U.S. PATENT DOCUMENTS

| | | | |
|---|---|---|---|
| 4,135,165 | 1/1979 | Coe | 331/11 |
| 4,506,233 | 3/1985 | Englund, Jr. | 331/17 |
| 5,254,958 | 10/1993 | Flach et al. | 331/16 |

*Primary Examiner*—Siegfried H. Grimm
*Attorney, Agent, or Firm*—Oblon, Spivak, McClelland, Maier & Neustadt, P.C.

[57] ABSTRACT

A radio-frequency module detachably mounted to a transmitter in a radio-control apparatus to supply a high frequency signal to a transmitter. The module includes a phase-lock loop (PLL) circuit along with low pass filters and a voltage controlled oscillator to form a PLL oscillator loop. A rotary switch which is manually set provides an indication to a microprocessor of the desired frequency. The microprocessor supplies the PLL circuit with frequency data. An error voltage is generated by the low pass filters.

3 Claims, 5 Drawing Sheets

RADIO-FREQUENCY MODULE WITH PHASE LOCK LOOP AND FREQUENCY SETTING

BACKGROUND OF THE INVENTION

1. Field of the Invention

This invention relates to a radio-frequency module detachably mounted in a body of a transmitter, which is equipped with a phase-lock loop oscillator (hereinafter referred to as "PLL oscillator"), and more particularly to a radio-frequency module suitably applied to a transmitter for a radio control apparatus.

2. Discussion of the Background

As shown in FIG. 3, a conventional radio control apparatus includes a transmitter body 1 which is formed, at a back face thereof, with a recessed mounting portion into which a radio-frequency (RF) module 2 is detachably mounted.

In the radio-frequency module 2, a radio-frequency circuit is incorporated in the form of a module to determine a frequency of a carrier wave and a mode of modulation thereof. Further, either a pulse position modulation (PPM) signal or a pulse code modulation (PCM) signal is used as a modulation signal to be supplied to the radio-frequency module 2. These modulation signals can be generated in response to an operational amount of a manipulation means, such as a stick lever, mounted on the transmitter body 1. When the modulation signal from the transmitter body 1 is supplied to the radio-frequency module 2, a carrier wave having a predetermined frequency, which is generated in the radio-frequency module 2, is modulated adequately.

The modulated carrier wave generated from the radio-frequency module 2 is delivered to one rod-type antenna 13 provided at the transmitter body 1 such that the modulated carrier wave is propagated from the antenna 13 into a surrounding space. Here, it should be noted that frequencies (frequency bands) of the carrier wave available for the radio control apparatus of such a type are prescribed differently in every country.

As a consequence, in order to make the radio control apparatus usable in every country, the radio-frequency module 2 mounted therein is so constructed as to be interchangeable with those of any other type. Alternatively, the setting values of the radio-frequency module 2 are rendered variable so that the frequency band or the frequency of the carrier wave can be adjusted optionally.

Meanwhile, in the case of the radio-frequency module 2 of the type which is interchangeable with another type module to change the frequency or frequency band of the carrier wave, a crystal oscillator is detachably mounted therein. To this end, a plurality of crystals having different oscillation frequencies must be prepared for the replacement upon demand to make the radio-frequency module 2 adjustable to various carrier frequencies.

In addition, in the case of the radio-frequency module 2 of the type in which the setting values are variable to change the frequency or frequency band of the carrier wave, a PLL oscillator is mounted therein. By this, the setting values of the radio-frequency module can be altered by applying thereto a command signal from the transmitter body 1 so that the radio-frequency module 2 generates carrier waves having various frequencies.

Accordingly, among the two types mentioned above, the radio-frequency module 2 of the type equipped with the PLL oscillator is more advantageous and convenient because only one radio-frequency module 2 is required to make the radio control transmitter apparatus applicable to various carrier frequencies. However, in a certain country, the radio-frequency module equipped with the PLL oscillator cannot be applied to the transmitter for the radio control apparatus. In such a country, the radio-frequency module of the type which is equipped with the crystal oscillator must have been used.

As mentioned above, since there exist two types of the radio-frequency modules 2, the transmitter body 1 normally has a structure which is capable of mounting both types of the radio-frequency modules 2.

As shown in FIGS. 4a and 4b, the radio-frequency module 2 equipped with the PLL oscillator is provided, at upper and lower end surfaces of its casing 20, with a pair of clamp members 21 which can be engaged with the transmitter body 1 to secure the radio-frequency module 2 to the transmitter body 1. Further, the radio-frequency module 2 of this type is formed, at a back face thereof opposite the transmitter body 1, with a projected portion 22.

The projected portion 22 of the radio-frequency module 2 has an outer surface opposite the transmitter body 1, on which a pair of connectors are provided. The connectors are coupled with those provided correspondingly on the transmitter body 1. Further, an RF substrate 24 in which a high-frequency circuit is incorporated and a PLL substrate 26 in which a PLL oscillator is incorporated is mounted in a casing 20 of the radio-frequency module 2.

Moreover, in FIG. 4c, there is shown, in a lateral section, the radio-frequency module 2 equipped with the PLL oscillator, which is fitted to the transmitter body 1. Upon mounting the radio-frequency module 2 in a housing 30 of the transmitter body 1, a casing 20 of the radio-frequency module 2 is inserted into a recessed mounting portion formed in the housing 30 of the transmitter body 1 until a shoulder portion 23 formed on the casing 20 of the radio-frequency module 2 is brought into a abutting engagement with a stepped portion 31 formed in the recessed mounting portion.

At this time, a lead derived from a first RF module connector 25, which is provided on the RF substrate 24 incorporated within the casing 20 of the radio-frequency module 2, is coupled with a first transmitter connector 32 which is provided in a recessed mounting portion of the transmitter body 1. Similarly, a second RF module connector 27, which is provided on the PLL substrate 26 incorporated in the casing 20 of the radio-frequency module 2, is coupled with a second transmitter connector 34 which is provided in the recessed mounting portion of the transmitter body 1.

In addition, a crystal type radio-frequency module (not shown) having a crystal oscillator therein can be also mounted in the recessed mounting portion of the housing 30 of the transmitter body 1. In this case, the crystal type radio-frequency module is provided with the first RF module connector 25 only, so that the first transmitter connector 32 of the transmitter body 1 is coupled with the first RF module connector 25 while the second transmitter connector 34 of the transmitter body 1 remains uncoupled.

Referring to FIG. 5, there is illustrated a block diagram for an essential part of the radio control transmitter apparatus which includes the radio-frequency module (MODULE) 2 fitted to the transmitter body (Tx Body) 1. The radio-frequency module 2 is of the type in which the PLL oscillator is incorporated.

As shown in FIG. 5, when the radio control transmitter apparatus is turned on and the user manipulates key buttons (KEY) 50, a microprocessor (CPU) 51 reads out a frequency data stored in a read only memory (ROM) 60 incorporated in the radio-frequency module 2. The microprocessor (CPU) 51 recognizes a designated value of frequency in response to the manipulation of key buttons (KEY) 50 by the user and then supplies the designated frequency data to the PLL circuit 61 incorporated in the radio-frequency module 2 to set the data therein.

The designated frequency data supplied to the PLL circuit 61 is then applied to a frequency divider provided therein to conduct a division of a frequency transmitted from a voltage-controlled oscillator (VCO) 63. The divided frequency from the frequency divider is applied to a phase-comparator to compare it with a reference oscillation frequency. An output signal of the phase-comparator is then delivered to both a first low pass filter (LPF1) 62 and a second low pass filter (LPF2) 65. An output signal from each of the low pass filters is applied as an error voltage signal to the voltage-controlled oscillator (VCO) 63 so that the error voltage signal controls a frequency generated from the voltage-controlled oscillator (VCO) 63 to a specific frequency value corresponding to the frequency data supplied from the microprocessor (CPU) 51.

When a PLL oscillator loop which consists of the PLL circuit 61, the first and second low pass filters (LPF1 and LPF2) 62 and 65 and the voltage-controlled oscillator (VCO) 63 is locked to the frequency data supplied from the microprocessor (CPU) 51, the locked condition is detected by a lock detector (LOCK DET) 67, upon which a lock detection signal is transmitted to the second low pass filter so that any error voltage signal is no longer supplied from the second low pass filter (LPF2) 65 to the voltage-controlled oscillator (VCO) 63.

That is, a cut-off frequency of the first low pass filter (LPF1) 62 is set to a low level to maintain a low steady-state deviation of the PLL oscillator loop. However, in this case, the first low pass filter (LPF1) 62 exhibits only a low response rate. Consequently, a frequency-responsive rate of the PLL oscillator loop is enhanced by incorporating therein the second low pass filter (LPF2) 65 having a high cut-off frequency until the loop is in the locked condition.

A modulation signal from a modulation circuit (MOD) 52 disposed in the transmitter body 1 is applied to the voltage-controlled oscillator (VCO) 63 to conduct a frequency shift keying (FSK) modulation. At this time, the second low pass filter (LPF2) 65 is turned off to improve the results of the frequency shift keying (FSK) modulation.

Meanwhile, the lock detection signal from the lock detector (LOCK DET) 67 is also transmitted to a radio-frequency amplifier (RF AMP) 64. Applied to the radio-frequency amplifier (RF AMP) 64 is also an RF-on signal (RF ON) which is generated from the microprocessor (CPU) 51 in the transmitter body 1 when a predetermined time elapses after the radio-frequency module 2 is turned on. When the RF-on signal is excited to an active level, the radio-frequency amplifier 64 is energized to transmit a carrier wave.

Since it takes the predetermined period of time until the PLL oscillator loop is locked to the designated frequency, the above-mentioned construction provides a measure for preventing the transmission of a carrier wave having undesirable frequency from the antenna 13, which tends to be generated for that period.

However, in the case where the conventional radio-frequency module accommodating the PLL oscillator is mounted to the transmitter body 1, the microprocessor in the transmitter body 1 reads out the frequency data from the read only memory (ROM) of the radio-frequency module and at the same time feeds back the frequency data to be set from the transmitter to the radio-frequency module. As a result, special terminals are required to be provided for the connection between the transmitter body and the radio-frequency module. This causes the problem that the radio-frequency module accommodating the PLL oscillator can be mounted merely to limited kinds of radio control transmitter apparatuses which have terminals connectable thereto.

Furthermore, the microprocessor provided in the transmitter body effects a variety of processes other than those mentioned above, so that there is tendency that the load of the microprocessor becomes too high. As a consequence, the radio-frequency module equipped with such a PLL oscillator is applicable to only a radio control transmitter apparatus which is equipped with a high-grade and therefore expensive microprocessor. This leads to a problem that the radio-frequency module cannot be fitted to many conventional radio control transmitter apparatuses.

In addition, the detection of the locked condition of the PLL oscillator loop is not conducted after the transmission of the RF-on signal, so that there also occurs the problem that undesirable frequency is erroneously transmitted when the locked condition of the PLL oscillator loop is canceled.

SUMMARY OF THE INVENTION

It is therefore an object of the present invention to provide a radio-frequency module equipped with a PLL oscillator, which can be connected with not only limited kinds of radio control transmitter apparatuses having such a special structure as mentioned above but also those having a general structure.

In order to accomplish the above-mentioned object, in accordance with the present invention, there is provided a radio-frequency module detachably mounted in a transmitter to apply a high-frequency signal to the transmitter, comprising a phase-lock loop (PLL) oscillator and a frequency-setting means capable of setting and controlling by itself a carrier frequency generated at the PLL oscillator.

A preferred form of the radio-frequency module according to the present invention, further comprises a lock detection means for detecting the locked condition of the PLL oscillator. The lock detection signal generated from the lock detection means functions to set a cut-off frequency of a low pass filter, which transmits an error voltage signal to a voltage-controlled oscillator, to a low level. In this case, the voltage-controlled oscillator undergoes a frequency shift keying (FSK) modulation by a modulation signal supplied from the transmitter.

In a further preferred form of the radio-frequency module according to the present invention, the lock detection means and the frequency-setting means are constituted by a microprocessor. The microprocessor generates a control signal to an amplifier after a predetermined time elapses after the radio-frequency module is turned on. Such a control signal functions to activate the amplifier so that an output from the voltage-controlled oscillator is amplified therethrough.

According to the present invention, setting and controlling of a frequency of a carrier wave generated from the PLL oscillator can be conducted only by a frequency-setting means which is disposed in the radio-frequency module so that it is not necessary to control the radio-frequency module from the side of the transmitter to which the radio-frequency module is mounted. As a consequence, it is not required to provide dedicated terminals for controlling the PLL oscillator mounted in the radio-frequency module. This results in reduction of number of terminals provided in the radio-frequency module or the transmitter so that reduction in a production cost is realized.

In addition, the radio-frequency module has such a structure that change-over of the cut-off frequency of the low pass filter can be conducted by the microprocessor. This makes it possible to control the PLL oscillator by a software which leads to reduction in number of parts required for controlling the radio-frequency module.

Further, in the radio-frequency module according to the present invention, the cancellation of the locked condition of the PLL oscillator can be detected after the amplifier is activated to amplify the radio-frequency signal. As a result, resetting of the frequency is possible even if the cancellation of the locked condition of the PLL oscillator has occurred, so that the system is restorable.

In this case, conventionally, the resetting of the frequency must be done only after the power switch is turned off and therefore the restoration of the system takes several seconds. On the other hand, in accordance with the present invention, the resetting of the frequency is automatically conducted by the microprocessor so that the system can be immediately restored even when the cancellation of the locked condition of the PLL oscillator occurs.

These and other objects, advantages, features of the present invention will become more apparent from the following detailed description of a preferred embodiment when read in conjunction with the accompanying drawings but it is to be understood that possible modifications or changes are made without departing from the spirit and scope of the present invention.

DETAILED DESCRIPTION OF THE PREFERRED EMBODIMENTS

The present invention is described in more detail with reference to the accompanying drawings.

Figure 1:
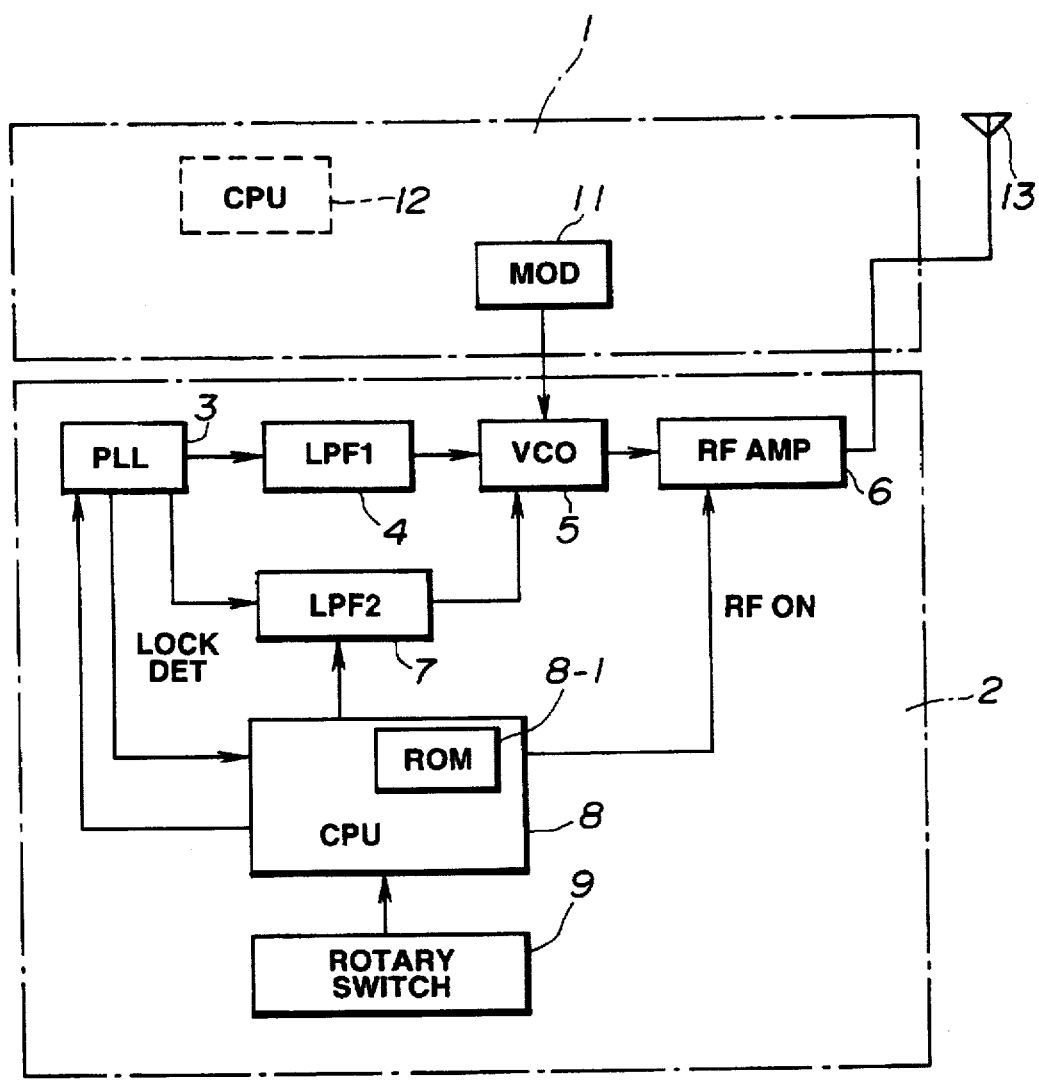
FIG. 1 is a schematic block diagram showing an essential part of a radio control transmitter apparatus equipped with a radio-frequency module according to the present invention, which incorporates a PLL oscillator therein.

Referring now to FIG. 1, there is schematically shown in block an essential part of a radio control transmitter apparatus 1 to which a radio-frequency module 2 according one preferred embodiment of the present invention is mounted. The radio-frequency module 2 incorporates therein a phase-lock loop (PLL) circuit 3.

In FIG. 1, the radio-frequency (RF) module 2, in which the PLL circuit is incorporated, is further provided therein with a microprocessor (CPU) 8. When the radio control transmitter apparatus composed of the transmitter body 1 and the radio-frequency module 2 is turned on, the microprocessor (CPU) 8 recognizes a designated value of a frequency which is set at a rotary switch 9 by the user of the radio control transmitter apparatus. Following the recognition of the designated value of the frequency, the microprocessor (CPU) 8 reads out the corresponding individual frequency data from a frequency data stored in a read only memory (ROM) 8-1. The read-out individual frequency data is supplied to a PLL circuit 3 incorporated in the radio-frequency module 2 so that the individual frequency data is set to the PLL circuit 3.

The frequency data supplied to the PLL circuit 3 is then set to a frequency divider provided in the PLL circuit 3 to conduct a division of the frequency delivered from a voltage-controlled oscillator (VCO) 5. The divided frequency is transmitted to a phase comparator where a phase of the divided frequency is compared with that of a reference frequency generated from a reference frequency-generating oscillator incorporated in the PLL circuit 3. An output (phase-comparison signal) from the phase comparator is delivered to a first low pass filter (LPF1) 4 and a second low pass filter (LPF2) 7. Output from these low pass filters are applied as error voltage signal to the voltage-controlled oscillator (VCO) 5. As a result, the voltage-controlled oscillator (VCO) 5 is controlled to generate a carrier wave having a frequency which is consistent with the frequency designated by the rotary switch 9.

Further, when a PLL oscillator loop constituted by the PLL circuit 3, the first and second low pass filters (LPF1 and LPF2) 4 and 7 and the voltage-controlled oscillator (VCO) 5 is locked to the frequency data supplied from the read only memory (ROM) 8-1, the lock condition is detected by the microprocessor (CPU) 8 to which the lock detection signal (LOCK DET) is applied from the PLL circuit 3. Once the lock condition is detected, the microprocessor controls the second low pass filter (LPF2) 7 such that the output signal from the second low pass filter (LPF2) 7 which represents an error voltage, is no longer supplied to the voltage-controlled oscillator (VCO) 5.

A cut-off frequency of the first low pass filter (LPF1) 4 is adjusted to a low level so as to maintain a low steady-state deviation of the PLL oscillator loop. This however leads to lowering a response speed of the PLL oscillator loop. Consequently, the second low pass filter (LPF2) 7 having a high cut-off frequency is incorporated in the PLL oscillator loop to enhance the response speed thereof until the loop is in the locked condition. As a result, the PLL oscillator loop is brought into the locked condition at an extremely high speed.

Further, the modulation signal generated from a modulation circuit (MOD) 11 incorporated in the transmitter body 1 is applied to the voltage-controlled oscillator (VCO) 5 to conduct a frequency shift keying (FSK) modulation. The frequency shift keying (FSK) modulation is improved by turning the second low pass filter (LPF2) 7 off.

Furthermore, the microprocessor (CPU) 8 applies an RF-on (RF ON) signal to the radio-frequency amplifier (RF AMP) 6. The RF-on (RF ON) signal is generated from the microprocessor (CPU) 8 when a predetermined time elapses after the radio-frequency module 2 is connected to a power source. When the RF-on signal is excited to an active level, the radio-frequency amplifier 6 is activated to transmit a carrier wave. The carrier wave generated from the radio-frequency amplifier 6 is transmitted to an antenna 13 of a rod-type provided in the transmitter body 1 and propagated into a surrounding space.

Thus, the action of the radio-frequency amplifier (RF AMP) 6 is shut off for the predetermined period of time. The reason therefor is that, since it takes such a predetermined time until the PLL oscillator loop is locked to the designated frequency, it must be prevented for the period to transmit the carrier wave having an undesired frequency, which is generated in an unlock condition of the PLL oscillator loop, to the antenna 13.

Meanwhile, the microprocessor (CPU) 8 continuously monitors the lock detection signal (LOCK DET) after the RF-on signal of the active level is applied to the radio-frequency amplifier 6. As soon as the locked condition of the PLL oscillator loop is canceled, the microprocessor (CPU) 8 reads out again the frequency data from the read only memory (ROM) 8-1 to reset the PLL circuit 3. As a result, the system-down of the radio control transmitter apparatus can be prevented.

If the locked condition is not established even after the resetting of the PLL circuit 3, the transmission of the RF signal is interrupted so that the radio-frequency amplifier 6 is shut off so as to prevent the transmission of the undesired carrier wave to the antenna 13.

The thus constructed radio-frequency module 2 incorporating the PLL oscillator can be mounted to the transmitter body 1 of any type having a mounting portion therefor, irrespective of whether the transmitter body 1 is equipped with a microprocessor (CPU) 12.

Figure 2:
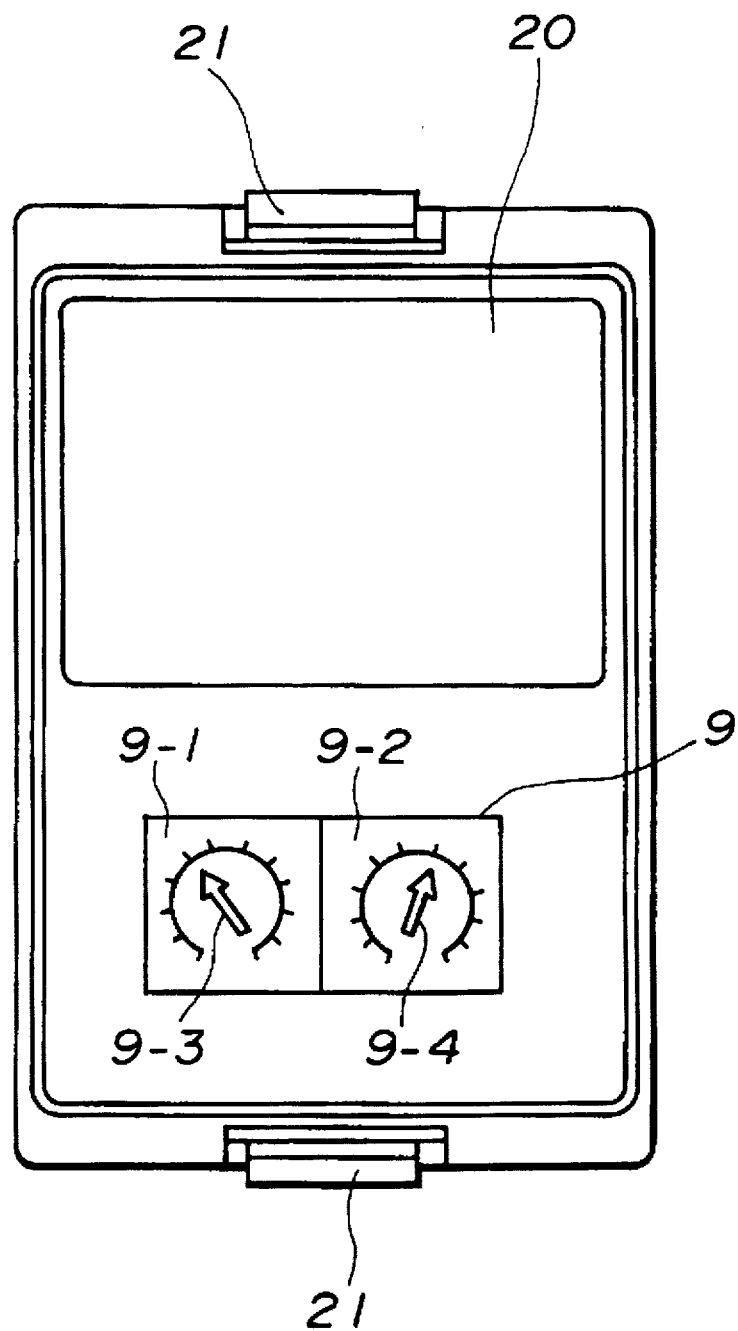
FIG. 2 is a front view showing one preferred embodiment of a radio-frequency module according to the present invention.
Figure 3:
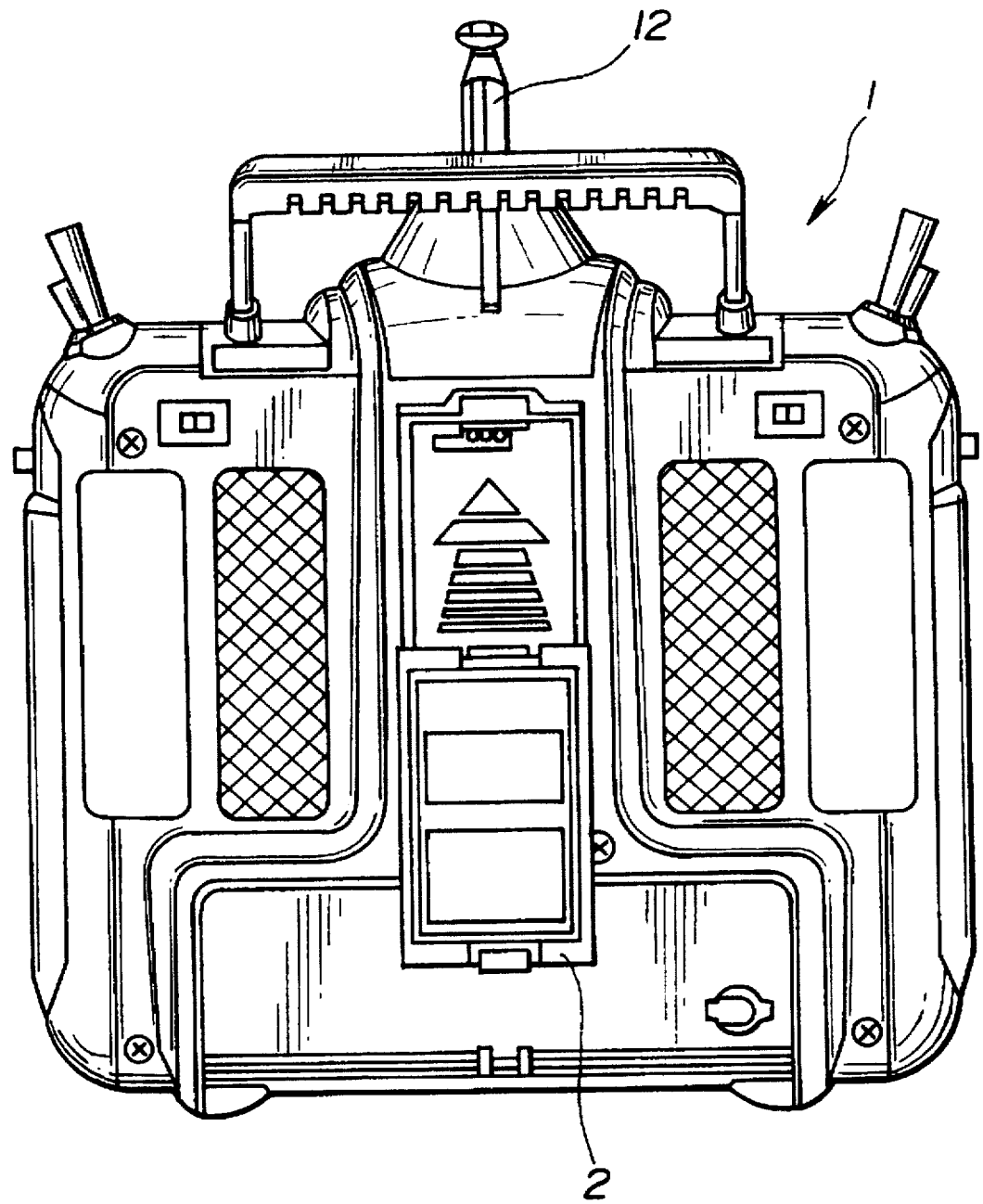
FIG. 3 is a view illustrating a condition in which a conventional radio-frequency module is fitted to a body of the radio control transmitter apparatus.
Figure 4A:
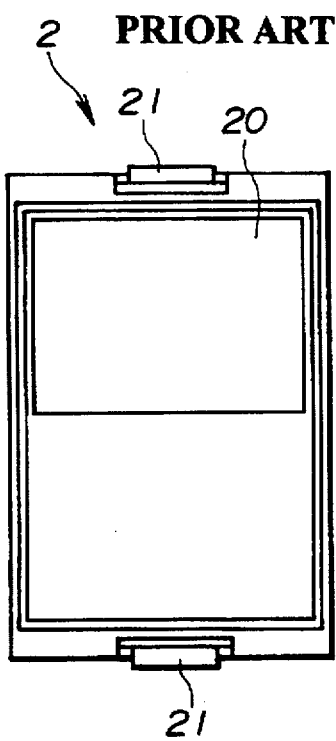
FIGS. 4a and 4b are front and top plan views, respectively, illustrating a construction of a conventional radio-frequency module incorporating a PLL oscillator.
Figure 4B:
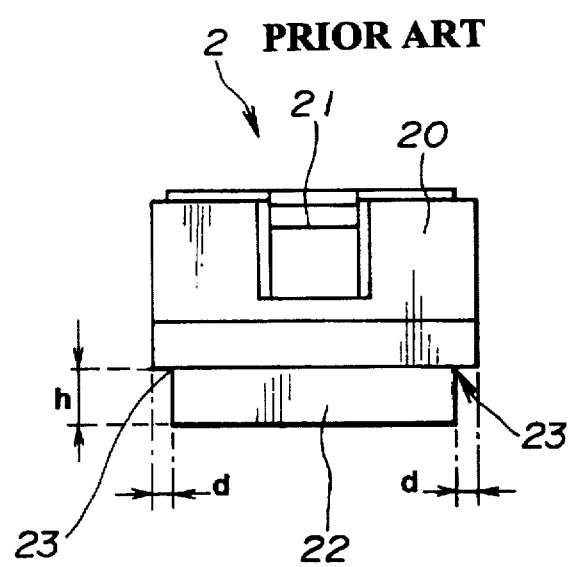
Figure 4C:
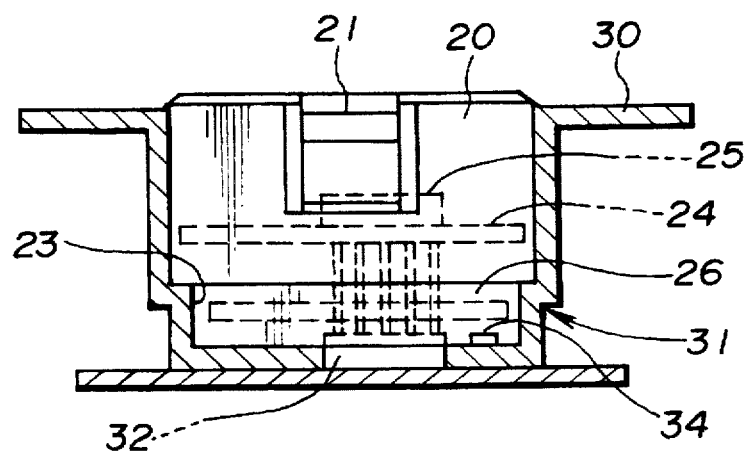
FIG. 4c is a top plan view, partially in section, illustrating the condition in which the conventional radio-frequency module shown in FIGS. 4A and 4B is mounted to a body of the radio control transmitter apparatus.
Figure 5:
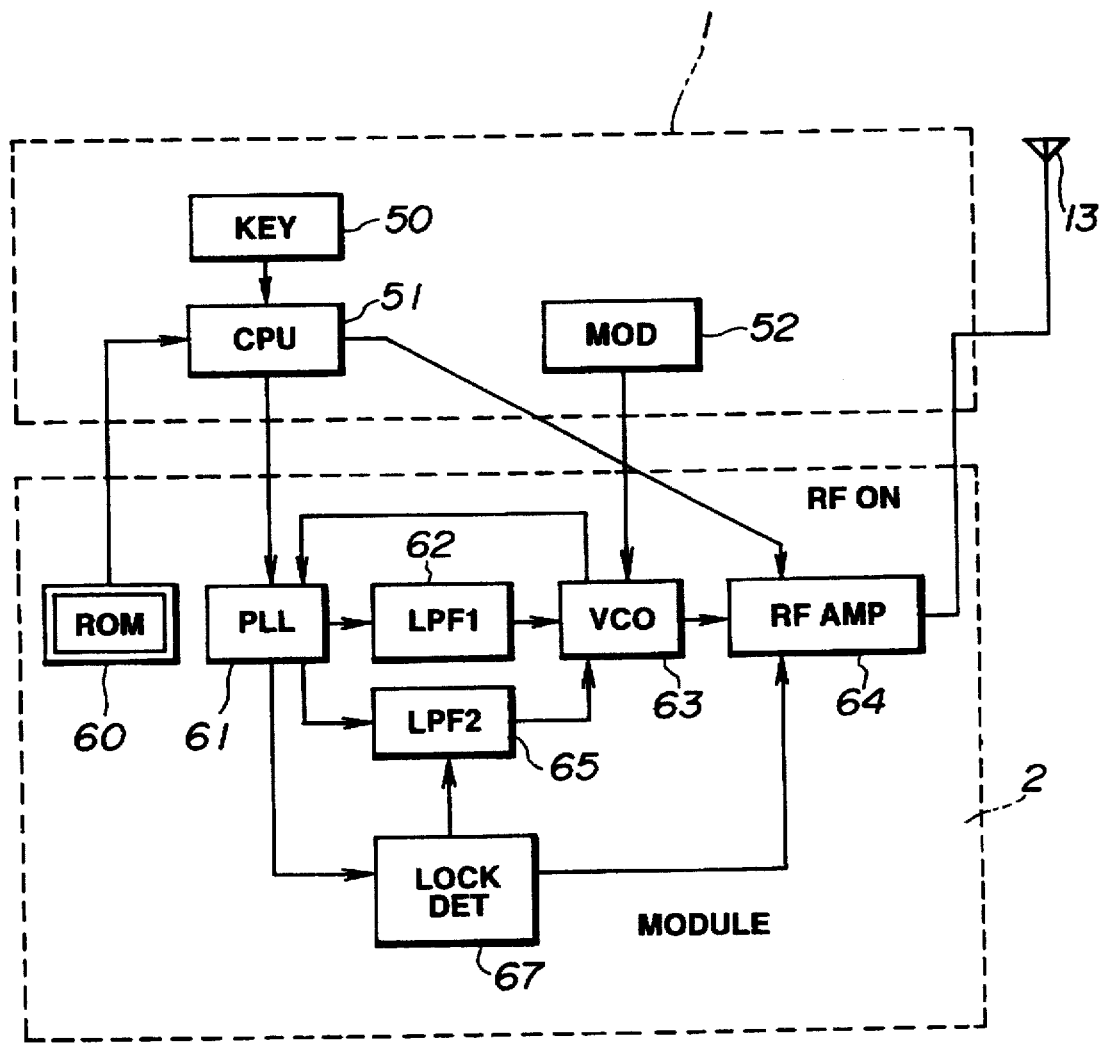
FIG. 5 is a schematic block diagram illustrating an essential pat of the conventional radio control transmitter apparatus equipped with the radio-frequency module incorporating the PLL oscillator.

An outer appearance of one example of the radio-frequency module 2 incorporating the PLL oscillator as mentioned above, is illustrated in FIG. 2 which is a front elevation view thereof. The radio-frequency module 2 is provided on a front surface thereof with a rotary switch 9. The rotary switch 9 is constituted by, for example, two digit-setting portions 9-1 and 9-2 capable of setting respective two-digit numbers to thereby transmit a code such as a BCD code representing a designated value of the frequency to be set. In this case, the designated value of frequency can be altered or corrected by operating rotatable indicator elements 9-3 and 9-4 provided for setting the respective digit numbers, so that desired code corresponding to the altered or corrected frequency value can be transmitted therefrom.

Incidentally, in the above-mentioned embodiment according to the present invention, although the rotary switch 9 is provided on the front surface of the casing 20 of the radio-frequency module 2, it may be provided on a back surface thereof.

As is apparently understood, the present invention is not limited to the above mentioned preferred embodiment in which the radio-frequency module is applied to the radio control transmitter apparatus. For example, the radio-frequency module of the present invention is also applicable to generally-used transmitters and receivers, transceivers for citizen band (CB) and amateur radio-communication, or the like.

As mentioned above, in accordance with the present invention, since the radio-frequency module is provided with the frequency-setting means capable of controlling and setting by itself the frequency of the carrier wave generated from the PLL oscillator, it is not necessary to control the radio-frequency module from the side of the transmitter body on which the module is mounted. As a consequence, it is not required to provide dedicated terminals for controlling the PLL oscillator incorporated in the radio-frequency module. Accordingly, reduction in number of parts required and lowering of the production cost can be realized.

In addition, the radio-frequency module has such a structure that change-over of the cut-off frequency of the low pass filter can be conducted by the microprocessor. This makes it possible to control the PLL circuit by a software which leads to reduction in number of parts required for controlling the radio-frequency module.

Further, the locked condition of the PLL oscillator loop is continuously monitored after the activation of the amplifier for amplifying the radio-frequency signal, so that unlocked condition of the PLL oscillator loop can be detected when it occurs. As a result, the system-down of the apparatus is prevented and the system can be immediately restored by resetting the frequency data even when the lock condition of the PLL oscillation circuit is canceled.

Conventionally, the resetting of the frequency data can be conducted only after restart of the power source so that it takes several seconds until the system is restored. Whereas, in the radio-frequency module according to the present invention, the microprocessor (CPU) can conduct the resetting of the frequency data so that the system can be immediately restored.

What is claimed as new and is desired to be secured by Letters Patent of the United States:

1. A radio-frequency module detachably mounted to a transmitter to apply a high-frequency signal to said transmitter, comprising:

a phase-lock loop (PLL) circuit;

a microprocessor including a lock detection means and a frequency-setting means;

said frequency-setting means being capable of setting and controlling by itself a frequency of a carrier wave generated at said PLL circuit;

said lock-detection means detecting a locked condition of said PLL circuit and generating a lock signal when the locked condition of said PLL circuit is detected;

a voltage-controlled oscillator;

at least one low-pass filter applying an output signal indicative of an error voltage to said voltage-controlled oscillator, wherein a cut-off frequency of said at least one low-pass filter is set to a low level when said lock signal is generated; and a radio-frequency amplifying means for amplifying an output from said voltage-controlled oscillator, wherein said radio-frequency amplifying means is activated by a control signal generated from said microprocessor when a predetermined time elapses after the connection between the radio-frequency module and a power source is established.

2. The radio-frequency module according to claim 1, wherein said voltage-controlled oscillator undergoes a frequency shift keying (FSK) modulation by a modulation signal supplied from said transmitter.

3. A radio-frequency module according to claim 1, further comprising:

a rotary switch for setting a frequency, said frequency being recognized by said microprocessor, causing a frequency data corresponding to said frequency to be read out from a read only memory.

* * * * *